United States Patent [19]

Bencivenga et al.

[11] Patent Number: 5,341,314

[45] Date of Patent: Aug. 23, 1994

[54] METHOD FOR GENERATING A TEST TO DETECT DIFFERENCES BETWEEN INTEGRATED CIRCUITS

[75] Inventors: Robert Bencivenga, Somerville; Scott Davidson, Pennington; Victor J. Velasco, Montgomery, all of N.J.

[73] Assignee: AT&T Bell Laboratories, Murray Hill, N.J.

[21] Appl. No.: 939,758

[22] Filed: Sep. 2, 1992

[51] Int. Cl.$^5$ .......................... G01R 31/28; G06G 7/48
[52] U.S. Cl. ...................................... 364/578; 371/23; 371/25.1; 371/68.1
[58] Field of Search ................. 364/578; 371/23, 25.1, 371/68.1, 68.3

[56] References Cited

U.S. PATENT DOCUMENTS

| | | | |
|---|---|---|---|
| 4,122,995 | 10/1978 | Franke | 371/68.3 X |
| 4,426,699 | 1/1984 | Tanaka et al. | 371/68.1 |
| 4,773,028 | 9/1988 | Tallman | 371/25.1 X |
| 4,837,765 | 6/1989 | Suzuki | 371/25.1 X |
| 5,128,944 | 7/1992 | Flaherty et al. | 371/68.1 X |

OTHER PUBLICATIONS

Cheng et al., "Gentest: An Automatic Test-Generation System for Sequential Circuits", Computer, vol. 22 No. 4, Apr. 1989, pp. 43–49.

Bencivenga et al., "The Architecture of the GentTest Sequential Test Generator", IEEE 1991 Custom IC Conference, May 1991, pp. 17.1/1–4.

*Primary Examiner*—Jack B. Harvey
*Assistant Examiner*—Eric W. Stamber
*Attorney, Agent, or Firm*—Robert B. Levy

[57] ABSTRACT

A test (i.e., a set of test vectors) for differentiating between two different integrated circuit versions (12,14) is established by first modeling the circuits in a simulated system such that: (a) the corresponding inputs of the circuits are coupled in parallel, (b) the corresponding outputs of the circuits are exclusively OR'd by a separate one of a plurality of exclusive OR gates ($18_1, 18_2, 18_3 \ldots 18_m$), and (c) the outputs of the exclusive OR gates are OR'd by an OR gate (20). Thereafter, a set of test vectors is generated, using conventional techniques, such that the vectors, when input to the different-version integrated circuits, cause a predetermined logic level signal to the OR gate (20).

3 Claims, 1 Drawing Sheet

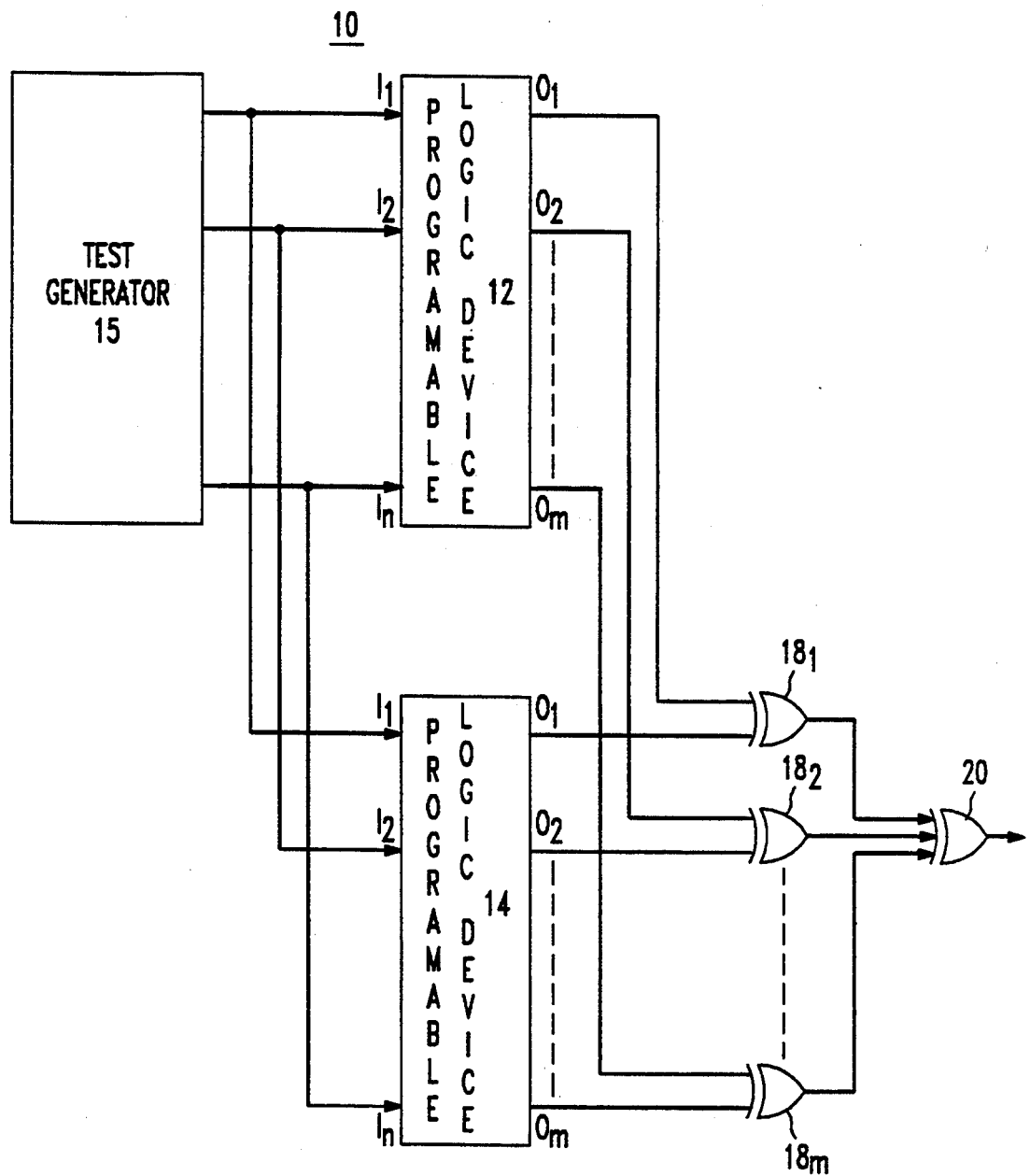

METHOD FOR GENERATING A TEST TO DETECT DIFFERENCES BETWEEN INTEGRATED CIRCUITS

TECHNICAL FIELD

This invention relates to a method for generating a set of test vectors for detecting differences between different versions of an integrated circuit, and especially, different versions of a programmable logic device.

BACKGROUND OF THE INVENTION

There now exists a class of integrated circuits whose functions can be altered without changing the overall design of the circuit. Examples of such integrated circuits are Programmable Logic Devices (PLDs) and Field Programmable Gate Arrays (FPGAs), hereafter collectively referred to as "programmable ICs." The cost of manufacturing and programming a new version of a programmable IC is low. As a consequence, a circuit designer can easily upgrade and/or enhance the operation of a circuit containing a programmable IC by substituting a newly programmed one for an earlier version.

A difficulty associated with using programmable ICs is that a later-programmed version has the same physical appearance as an earlier-programmed version, even though the two ICs will have different electrical characteristics owing to the differences in the manner in which each is programmed. From a manufacturing standpoint, it is essential that the correct (generally, the latest-programmed) version of a programmable IC be assembled on a circuit board because the use of an earlier-programmed version may lead to a possible circuit board failure. To avoid this type of difficulty, most manufacturing facilities which assemble circuit boards containing programmable ICs use a variety of techniques to track the different versions of each type of programmable IC. However, despite careful attempts to differentiate between different versions of the same programmable IC, not infrequently, an incorrect (i.e., an earlier-programmed) version is incorrectly assembled on a circuit board.

Unfortunately, conventional fault testing techniques often do not reveal the presence of an incorrect version of a programmable IC on a circuit board. Thus, a faulty circuit board (i.e., one containing an incorrect version of a programmable IC) may go undetected after conventional fault testing. The inability to detect a faulty board greatly increases the risk of a possible field failure. Such field failures are costly and lead to customer dissatisfaction.

Thus, there is a need for a technique to detect different versions of an integrated circuit.

SUMMARY OF THE INVENTION

Briefly, in accordance with the invention, a technique is provided for generating a test (i.e., providing a set of test vectors) for detecting if two or more circuits are indeed electrically different from each other. The technique is initiated by first simulating a system containing the different-version circuits such that:

(1) the different-version circuits have their corresponding inputs coupled in parallel;
(2) the output of each circuit is exclusively OR'd with a corresponding output of the other circuits; and
(3) the exclusively OR'd outputs of the circuits are OR'd. Once such a system is simulated, a set of test vectors is generated, using a conventional test pattern generator, to generate a test for a "stuck-at-zero" fault at the output of the simulated OR gate which collectively OR's the exclusively OR'd output signals of the different-version devices. Since the system is simulated so the corresponding outputs of the different-version circuits are exclusively OR'd, a set of test vectors, generated to test for a stuck-at-zero fault at the output of the simulated OR gate, will force the output of at least one of the simulated exclusive OR gates to generate a logic "1." This is exactly the type of test which will differentiate between two different-version circuits.

BRIEF DESCRIPTION OF THE DRAWING

FIG. 1 is a block schematic diagram of a model of a simulated system containing two different-version integrated circuits, which model is utilized, in accordance with the invention, for developing a test for detecting whether two different-version integrated circuits are indeed electrically different.

DETAILED DESCRIPTION

Referring to FIG. 1, there are shown two separate blocks 12 and 14, each representing a different version of a particular type of digital integrated circuit. In the illustrated embodiment, the circuits 12 and 14 represent different versions (i.e., differently programmed copies) of a particular type of programmable integrated circuit, such as a Programmable Logic Device (PLD) or a Field Programmable Logic Array (FPLA). The different programs within each of the circuits 12 and 14 render them electrically different from each other. However, both of the circuits 12 and 14 invariably have the same appearance so that it is usually not possible to distinguish one from the other based on physical observation alone.

Conventional testing of the circuits 12 and 14, to detect whether each circuit is operating properly, is typically carried out with the aid of a test generator 15, which injects a set of test vectors into the circuit inputs $I_1, I_2, I_3 \ldots I_n$, (where n is an integer). The test vectors injected into the inputs of each of the circuits 12 and 14 are typically generated in accordance with an electrical description of the circuit, using a well-known test generation program such as GENTEST ™, made by AT&T, or PLD Test Plus ™, produced by Data I/O.

In response to the test vectors at the inputs of the circuits 12 and 14, each circuit produces a response at its outputs $O_1, O_2, O_3 \ldots O_m$ (where m is an integer). By comparing the response of each of the circuits 12 and 14 to a reference or "golden" circuit of the same type (i.e., programmed in the same manner), the operation of each circuit can be verified. However, because of the differences in the manner that the circuits 12 and 14 are programmed, comparing the responses will not generally reveal whether the circuits are electrically different from each other.

In accordance with the invention, a technique is provided for generating a test (i.e., a set of test vectors) for successfully differentiating between different versions 12 and 14 (i.e., differently programmed copies) of the same programmable integrated circuit. In order to generate such a set of vectors, the circuits 12 and 14 are modeled in a simulated system shown in FIG. 1, typically using a conventional circuit modeling program, as is known in the art. As will be discussed below, it is this model which is utilized to generate a set of vectors which can differentiate between the circuits 12 and 14.

The model shown in FIG. 1 is created so as to have the following distinct features. First, each of the circuits 12 and 14 has each of its inputs $I_1, I_2, I_3 \ldots I_n$ coupled in parallel with a corresponding input of the other circuit. Second, each of the circuits 12 and 14 has each of its corresponding outputs $O_1, O_2, O_3 \ldots O_m$ exclusively OR'd with the corresponding output of the other circuit by way of a separate one of a simulated set of exclusive OR gates $18_1, 18_2, 18_3 \ldots 18_m$. Third, the exclusive OR gates $18_1, 18_2, 18_3 \ldots 18_m$ have their output signals OR'd by a simulated OR gate 20.

Using the model shown in FIG. 1, a set of test vectors can be developed which can differentiate between the circuits 12 and 14. To differentiate between the circuits 12 and 14, the test vectors must cause a logic "1" to appear on at least one output of one of the circuits 12 and 14 (i.e., a "good" circuit) while a logic "0" appears at the corresponding output of the other (i.e., a "bad" circuit). When such a difference occurs between the corresponding output signals of the circuits 12 and 14, then the associated one of the exclusive OR gates $18_1, 18_2, 18_3 \ldots 18_m$, which serves to exclusively OR the signals from this pair of outputs, will generate a logic "1" at its output. In this way, a logic "1" appears at one of the inputs of the OR gate 20.

One way to cause a logic "1" to appear at one of the inputs of the OR gate 20 is to create a set of test vectors for testing the presence of a "stuck-at-zero" fault at the output of the OR gate. A stuck-at-zero fault is said to exist at the output of the OR gate 20 when the output signal of the OR gate remains at zero irrespective of the presence of one or more logic "1s" at its inputs. Thus, a set of test vectors for testing the presence of a stuck-at-zero fault at the output of the OR gate 20 in the model of FIG. 1 will always cause at least one of the inputs of the OR gate to be at a logic "1." One or more of the inputs to the OR gate 20 will be at a logic "1" when one of the exclusive OR gates $18_1, 18_2, 18_3 \ldots 18_m$ produces a logic "1," which occurs when at least one output of the circuits 12 and 14 differs from another. As may now be appreciated, a set of test vectors, which, when input to the circuits 12 and 14, modeled in the manner shown in FIG. 1, for the purpose of detecting a stuck-at-zero fault, thus serves to test (i.e., differentiate) the circuits 12 and 14.

Actual generation of a set of test vectors for testing a stuck-at-zero fault for the circuits 12 and 14, modeled in the manner shown in FIG. 1, is a straightforward task, and can be easily accomplished using a commercially available test generation program such as AT&T's GENTEST ™ program. To generate such a set of vectors, a description of the model of FIG. 1 (including a description of the circuits 12 and 14 as well as the exclusive OR gates $18_1, 18_2, 18_3 \ldots 18_m$ and the OR gate 20) is entered into the test generation program. Using a backtracking routine, such a test vector generator program serves to generate a set of vectors which place at least one logic "1" at the input of the OR gate 20. Thus, such a set of vectors serves to differentiate the circuits 12 and 14 from each other when the circuits are electrically different.

Once a set of vectors has been generated in accordance with the above-described technique, the vectors can then be utilized to test an individual one of the circuits 12 and 14. If the circuits 12 and 14 are indeed electrically different by virtue of the manner in which each is programmed, then applying a set of test vectors, generated as described above, will cause each circuit to generate at least one output signal different from the other. By comparing the responses generated by the circuits 12 and 14 following receipt of a set of test vectors generated as described, a determination can be made as to whether the circuits are indeed electrically different from each other.

It is to be understood that the above-described embodiments are merely illustrative of the principles of the invention. Various modifications and changes may be made thereto by those skilled in the art which will embody the principles of the invention and fall within the spirit and scope thereof.

We claim:

1. A method for differentiating between two different-version integrated circuits, comprising the steps of:
   (a) modeling the different-version integrated circuits in a system such that:
      (1) the different-version integrated circuits have their corresponding inputs coupled in parallel;
      (2) the different-version integrated circuits have each of their corresponding outputs exclusively OR'd by a separate one of a plurality of exclusive OR gates; and
      (3) the outputs of the exclusive OR gates are OR'd by an OR gate;
   (b) generating a set of vectors, which, when input to the modeled system to be used for differentiating different-version integrated circuits including the different-version integrated circuits, causes a predetermined logic value to appear on at least one input of the OR gate in the modeled system;
   (c) applying the set of vectors to each actual different-version integrated circuit to cause each to generate a response; and
   (d) comparing the response generated by each actual different-version integrated circuit to determine if any differences exist therebetween.

2. A method for generating a set of test vectors for differentiating different-version integrated circuits from each other, comprising the steps of:
   (a) modeling the different-version integrated circuits in a system such that:
      (1) the different-version integrated circuits have their corresponding inputs coupled in parallel;
      (2) the different-version integrated circuits have each of their corresponding outputs exclusively OR'd by a separate one of a plurally of simulated exclusive OR gates; and
      (3) the outputs of the exclusive OR gates are OR'd by a simulated OR gate;
   (b) generating a set of vectors, which, when input to the modeled system including the different-version integrated circuits, causes a predetermined logic value to appear on at least one input of the OR gate for differentiating different-version integrated circuits from each other.

3. The method according to claim 2 wherein two different-version integrated circuits contain different programs.

* * * * *

UNITED STATES PATENT AND TRADEMARK OFFICE
CERTIFICATE OF CORRECTION

PATENT NO. : 5,341,314
DATED : August 23, 1994
INVENTOR(S) : Robert Bencivenga, Scott Davidson, Victor J. Velasco It is certified that error appears in the above-identified patent and that said Letters Patent is hereby corrected as shown below:

Column 4, line 33, "including the" should be deleted.

Signed and Sealed this

Ninth Day of May, 1995

Attest:

*Attesting Officer*

BRUCE LEHMAN

*Commissioner of Patents and Trademarks*